United States Patent
Duesman et al.

[11] Patent Number: 6,031,727
[45] Date of Patent: Feb. 29, 2000

[54] PRINTED CIRCUIT BOARD WITH INTEGRATED HEAT SINK

[75] Inventors: Kevin G. Duesman; L. Jan Bissey, both of Boise, Id.

[73] Assignee: Micron Technology, Inc., Boise, Id.

[21] Appl. No.: 09/178,682

[22] Filed: Oct. 26, 1998

[51] Int. Cl.[7] ..................................................... H05K 3/46
[52] U.S. Cl. ...................... 361/761; 361/719; 361/720; 361/704; 361/709; 361/712; 361/713; 165/80.2; 165/185; 174/16.3; 174/252
[58] Field of Search ..................................... 361/761, 719, 361/720, 704–710, 712–713, 722; 165/80.2, 185; 174/16.3, 252

[56] References Cited

U.S. PATENT DOCUMENTS

| | | | |
|---|---|---|---|
| 3,694,699 | 9/1972 | Snyder et al. | 361/705 |
| 4,528,835 | 7/1985 | Ekmark | 72/301 |
| 4,751,146 | 6/1988 | Maeda et al. | 428/475.8 |
| 5,365,402 | 11/1994 | Hatada et al. | 361/699 |
| 5,528,456 | 6/1996 | Takahashi | 361/704 |
| 5,567,986 | 10/1996 | Ishida . | |
| 5,661,339 | 8/1997 | Clayton | 257/678 |
| 5,673,177 | 9/1997 | Brodsky et al. | 361/704 |
| 5,675,474 | 10/1997 | Nagase et al. | 361/704 |
| 5,719,745 | 2/1998 | Agonhafer et al. . | |
| 5,751,553 | 5/1998 | Clayton . | |
| 5,757,073 | 5/1998 | Hoffmeyer . | |
| 5,779,134 | 7/1998 | Watson et al. . | |
| 5,830,311 | 11/1998 | Braun et al. | 156/471 |

*Primary Examiner*—Leo P. Picard
*Assistant Examiner*—David Foster
*Attorney, Agent, or Firm*—Dickstein Shapiro Morin & Oshinsky LLP

[57] ABSTRACT

According to the present invention, functional heat conducting planar layers within a printed circuit board (PCB) are corrugated to allow for enhanced heat dissipation. According to a preferred embodiment, at least one of the power and ground planes is at least partially corrugated to extract heat from the PCB. By corrugating heat conducting structures within the PCB, additional heat dissipating surface area is provided for the PCB without the need to provide any additional heat dissipating structure.

53 Claims, 6 Drawing Sheets

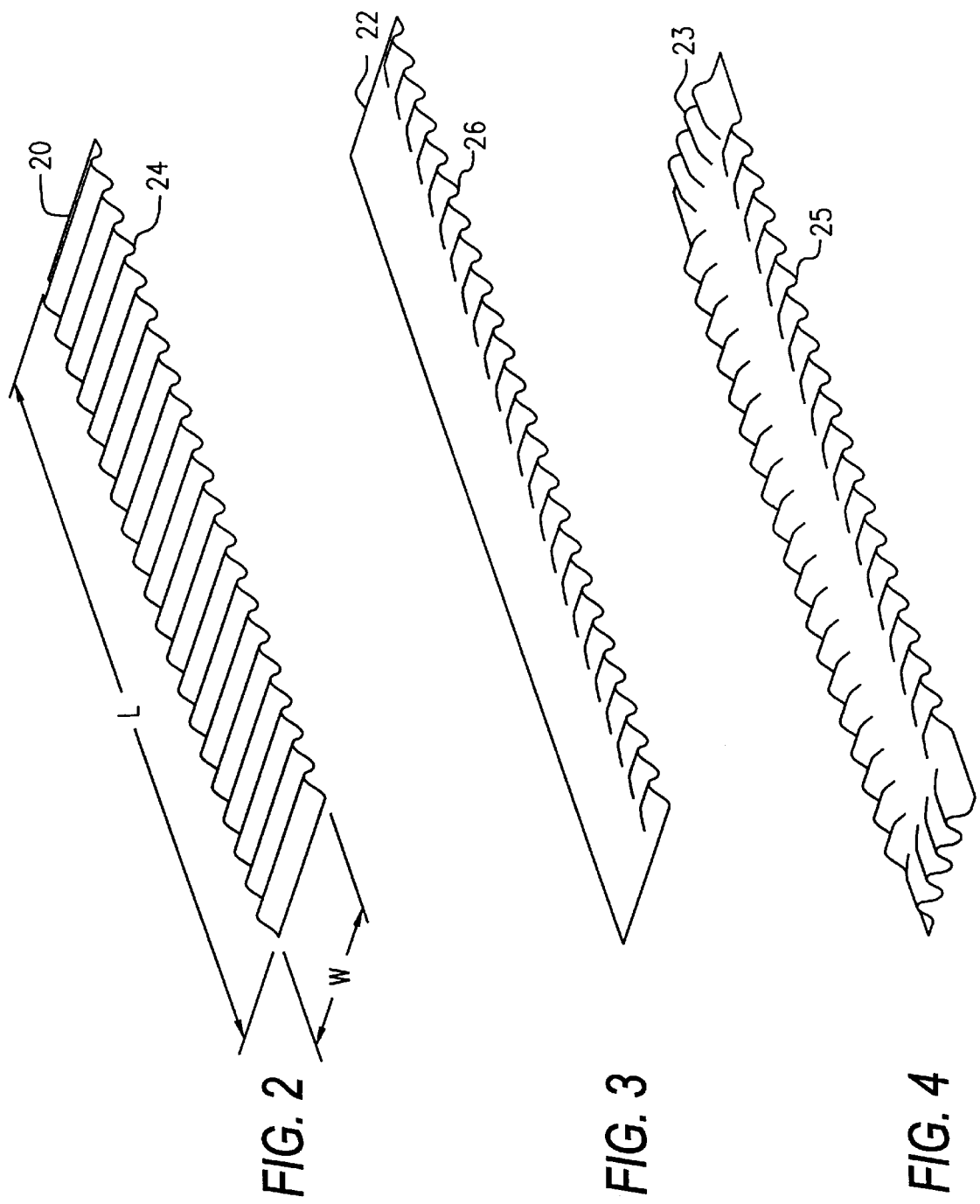

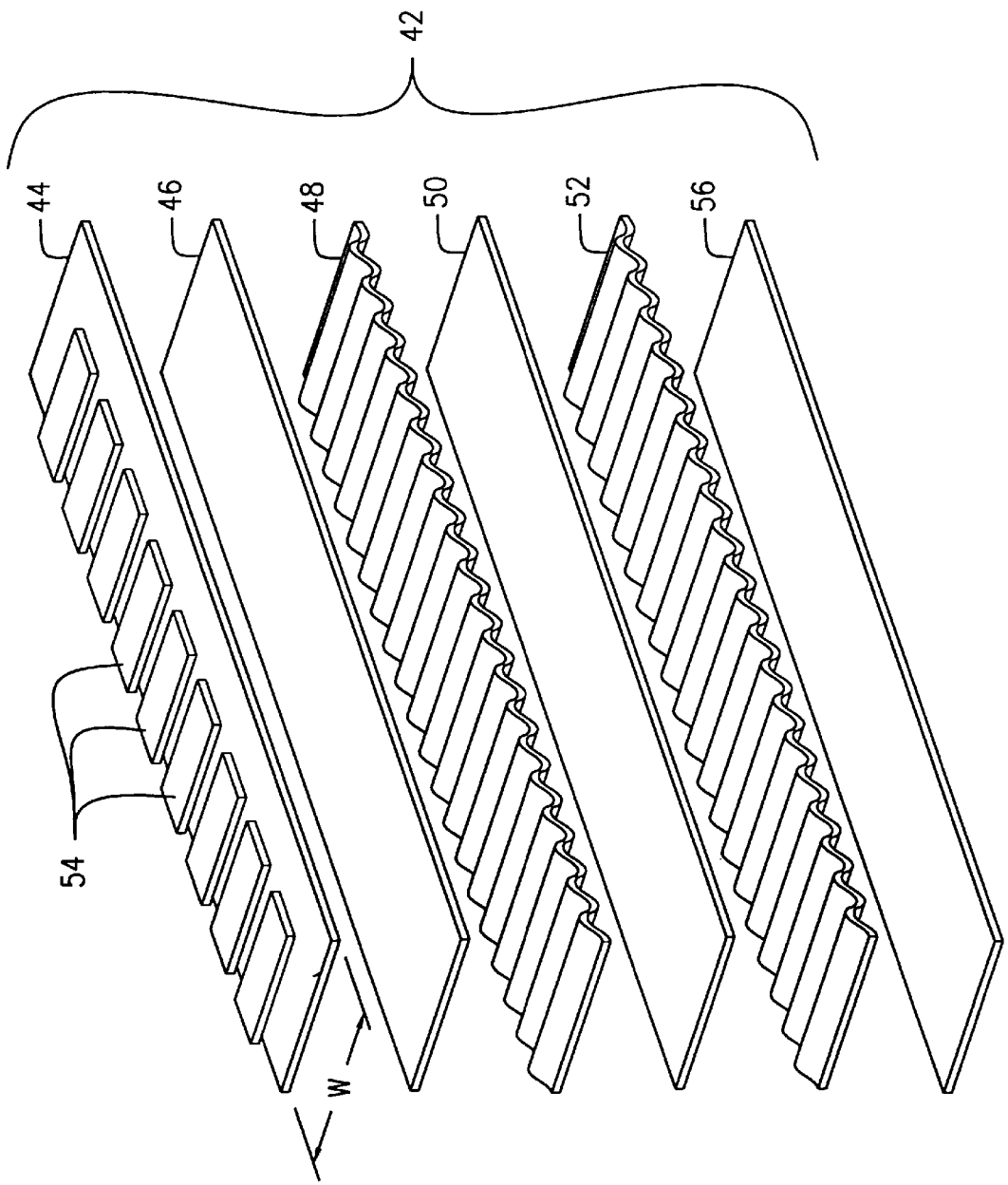

PRINTED CIRCUIT BOARD WITH INTEGRATED HEAT SINK

BACKGROUND OF THE INVENTION

1. Field of the Invention

The present invention relates to the field of integrated circuits. More particularly, the invention provides a method of integrating a heat sink within the structure of a multi-layer printed circuit board.

2. Description of the Related Art

A multi-layer printed circuit board (PCB) is a composite of organic and inorganic materials with external and internal conductors, allowing electronic components to be mechanically supported and electrically connected. A PCB typically contains multiple planar insulation layers interweaved with multiple planar metal layers. As illustrated in FIG. 1, an exemplary PCB 11 contains at least one metal layer 13 (device plane) that is patterned to transfer signals between the electronic components, one power plane 15 for distributing voltage throughout the PCB, and one ground plane 17, with planar insulating layers 19, 21, 23 located between the metal layer, power plane and ground plane, and on a bottom surface of PCB 11.

As integrated circuit technology has improved, substantially greater functionality has been incorporated into the electronic components such as integrated circuit processors, memories, logic devices, etc. which are mounted on PCB 11. In addition, the portability of computing and information management is driving the reduction in size from desktop to laptop to notebook sized products. Hence, as integrated circuits have expanded in functionality and become more complex with denser circuit packing, their size has also diminished resulting in increased power consumption and greater heat dissipation in physically smaller areas. Thus, modern integrated circuits generate more heat while possessing smaller surface areas to dissipate the heat.

To improve thermal efficiency, many package designs today employ additional structures to dissipate heat during the operation of the integrated circuit device. Many such structures are formed by attaching additional heat dissipating surfaces to the ground or power planes of a printed circuit board or directly to an integrated circuit device itself. Heat pipes and other heat removal devices are also often employed. The manufacturing and assembly costs associated with the use of additional structures for heat removal can be quite high.

What is needed is a relatively low cost technique which solves the aforementioned problems associated with removing heat from an integrated circuit device.

SUMMARY OF THE INVENTION

The present invention provides a low cost method of integrating a heat sink with a printed circuit board (PCB).

According to the present invention, functional heat conducting planar layers within a printed circuit board (PCB) are corrugated to allow for enhanced heat dissipation. According to a preferred embodiment, at least one of the power and ground planes is at least partially corrugated to extract heat from the PCB. By corrugating heat conducting structures within the PCB, additional heat dissipating surface area is provided for the PCB without the need to provide any additional heat dissipating structure.

These and other features and advantages of the invention will become more apparent from the following detailed description of preferred embodiments of the invention which are provide in connection with the accompanying drawings.

BRIEF DESCRIPTION OF THE DRAWINGS

FIG. 2 is a perspective view of a heat sink used in a first embodiment of the invention.

FIG. 3 is a perspective view of a heat sink used in a second embodiment of the invention.

FIG. 4 is a perspective view of a heat sink used in a third embodiment of the invention.

FIG. 5 is a perspective view of a printed circuit board of a first embodiment of the invention.

DETAILED DESCRIPTION OF PREFERRED EMBODIMENTS

Figure 1:
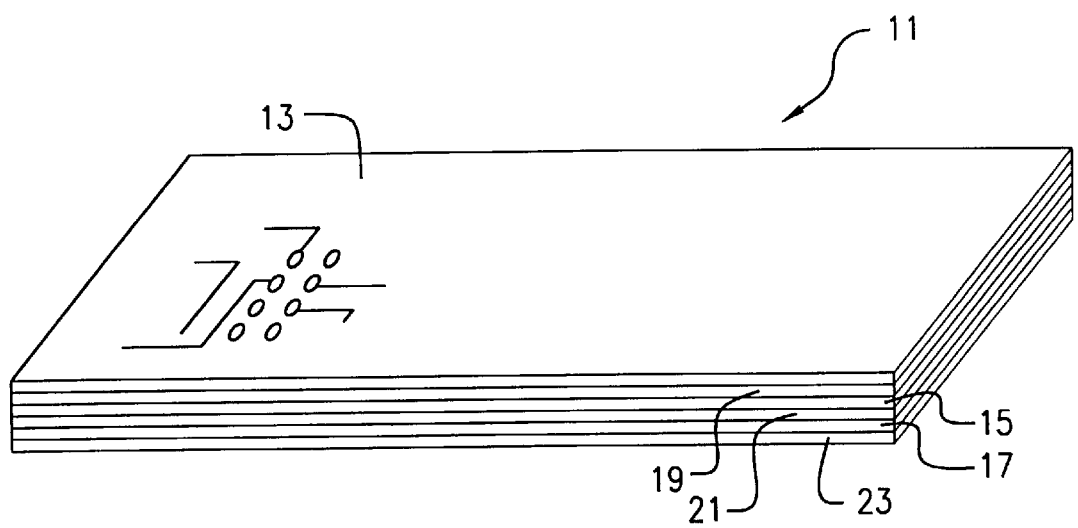
FIG. 1 is a perspective view of a conventional PCB.

In accordance with the present invention, functional heat conducting planar layers within a multi-layer printed circuit board (PCB) are corrugated to maximize heat dissipation within the PCB. According to the present invention, a functional heat conducting structure may include any planar structure typically found within a multi-level PCB included such structures as the grounding planes and layers, insulating planes and layers, padding planes and layers, shielding planes and layers, covering planes and layers, and power planes and layers. According to a preferred embodiment, as will be discussed below, at least one of the power and ground planes is corrugated. The corrugated heat conducting structure may also extend beyond the outer periphery of the multi-layer PCB.

In accordance with the present invention, the functional heat conducting planar structures of a PCB may be corrugated in any fashion in order to meet the design and heat dissipation requirements of each specific PCB. With reference to FIGS. 2, 3 and 4, functional planar structures corrugated in accordance with preferred embodiments of the present invention will now be described. Referring to FIG. 2, a preferred embodiment of a corrugated planar structure is shown. As shown in FIG. 2, a planar structure 20 has corrugation waves 24 spanning its entire width W and running along its entire length L. In FIG. 3, a planar heat conducting structure 22 is shown with the corrugation waves 26 extending over only a portion of the width of the planar structure 22 and running along its length. In FIG. 4, a planar heat conducting structure 23 is shown with the corrugation spanning only of portion of the width of the planar structure 23 and running around its entire peripheral edge. It is to be understood that each corrugation technique illustrated in FIGS. 2, 3 and 4 is merely illustrative of selective embodiments of the present invention and they are not intended to be limiting in any way.

As noted, each of the planar structures 20,22 and 23 of FIGS. 2–4 may be one or more of a conductor plane, such as a ground or power plane, an insulating plane, a padding plane, a shielding plane or a covering plane, typically used in a PCB construction.

With reference to FIG. 5, a PCB 42 employing corrugated planar structures in accordance with a preferred embodiment of the present invention is shown. In FIG. 5, integrated circuit devices 54, e.g. memory devices, are shown secured on a planar mounting surface 44 which contains a wiring interconnect pattern. Power plane 48 is provided to allow for the supply of power to devices 54. Ground plane 52 provides a ground conductor for devices 54. Insulating layers 46 and 50 are provided between layers 44 and 48 and layers 48 and 52. As shown in FIG. 5, the ground and power plane layers 48 and 52 are corrugated across their respective surfaces (as shown in FIG. 2 above) in order to provide for heat dissipation to occur within the PCB 42. A bottom insulate layer 56 may also be provided.

It should be noted that although FIG. 5 shows the power supply and ground layers 48, 52 as corrugated, these layers can remain planar and one or more of insulating layers 46, 50 and 56 could be corrugated instead.

Figure 6:
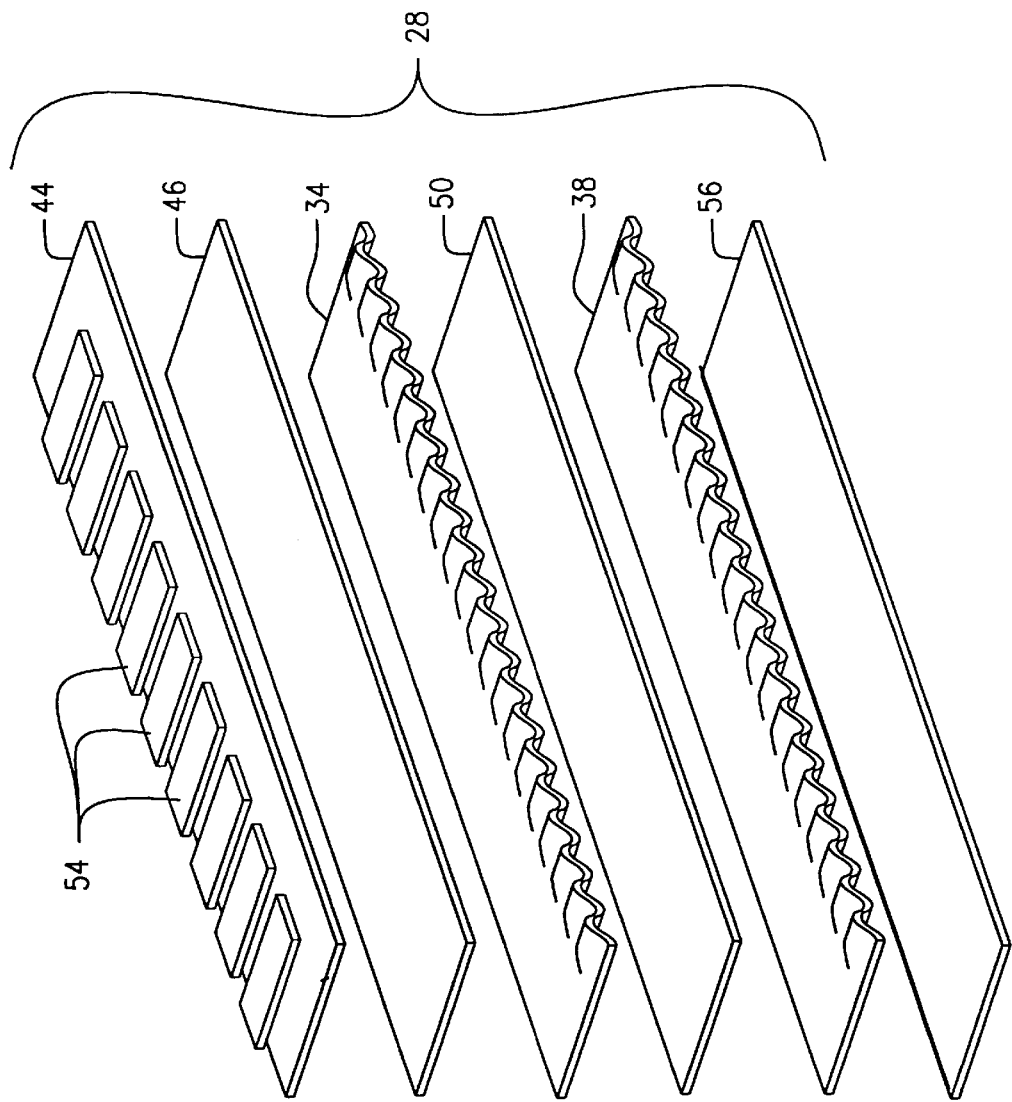
FIG. 6 is a perspective view of a printed circuit board of a second embodiment of the invention.

With reference to FIG. 6, an alternative embodiment of a PCB 28 is shown which includes power and ground planes 34, 38 that are corrugated along only one edge of their surfaces (as shown in FIG. 3 above). As shown in FIG. 6, integrated circuit devices 54, e.g. memory-devices, are secured on mounting surface 44 which contains an interconnect wiring pattern. Power plane 34 provides power to integrated circuit devices 54. Ground plane 38 provides a ground conductor for devices 54. Insulating layers 46, 50 are provided between layers 44 and 34 and between layers 34 and 38. A bottom insulating layer 56 may also be provided.

It is also possible to arrange the edge corrugations to partially or completely extend beyond the dimensions (the width and length) of the PCB 28. As with FIG. 5, it is also possible to keep the power supply and ground layers 34 and 38 flat and corrugate the edges of one or more of the insulating layers 46, 50, 56.

As shown, the invention provides a multi-layer PCB construction which is better able to dissipate heat at relatively low cost through the use of corrugations in one or more of the PCB layers.

One particular environment in which the PCB of the invention may be used is as a memory module for a processor-based system. In this case, the integrated circuits 54 may be integrated circuit memory devices such as DRAMS, SRAMS, EEPROM, etc. and the PCB may be constructed as a plug-in board for receipt in a system memory socket. A typical processor-based system, which includes the PCB of the present invention formed as a memory module, is illustrated generally at 600 in FIG. 7. A processor-based system typically includes a processor which connects through a bus structure with memory modules which contain data and instructions. The data in the memory modules is accessed during operation of the processor. This type of processor-based system is used in general purpose computer systems and in other types of dedicated processing systems, e.g. radio systems, television systems, GPS receiver systems, telephones and telephone systems to name a few.

Figure 7:
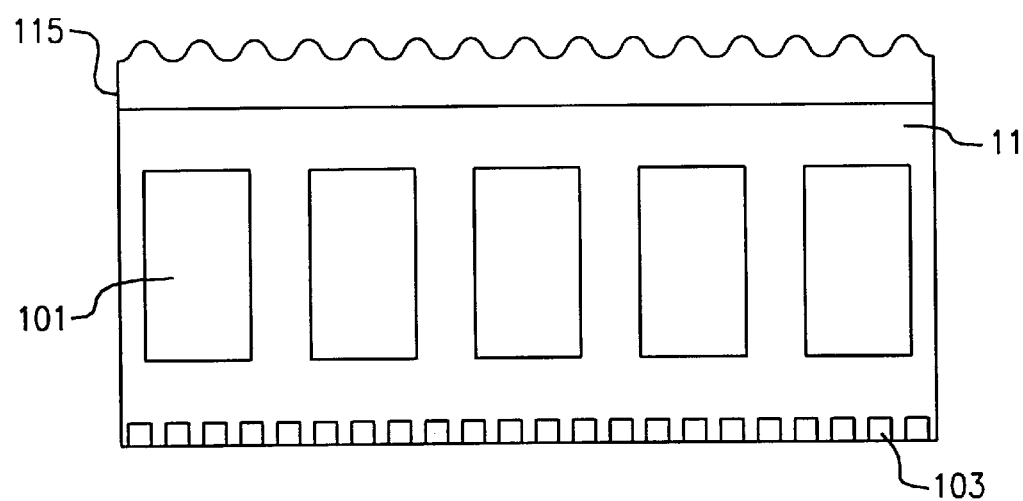
FIG. 7 is a memory module constructed in accordance with the invention.
Figure 8:
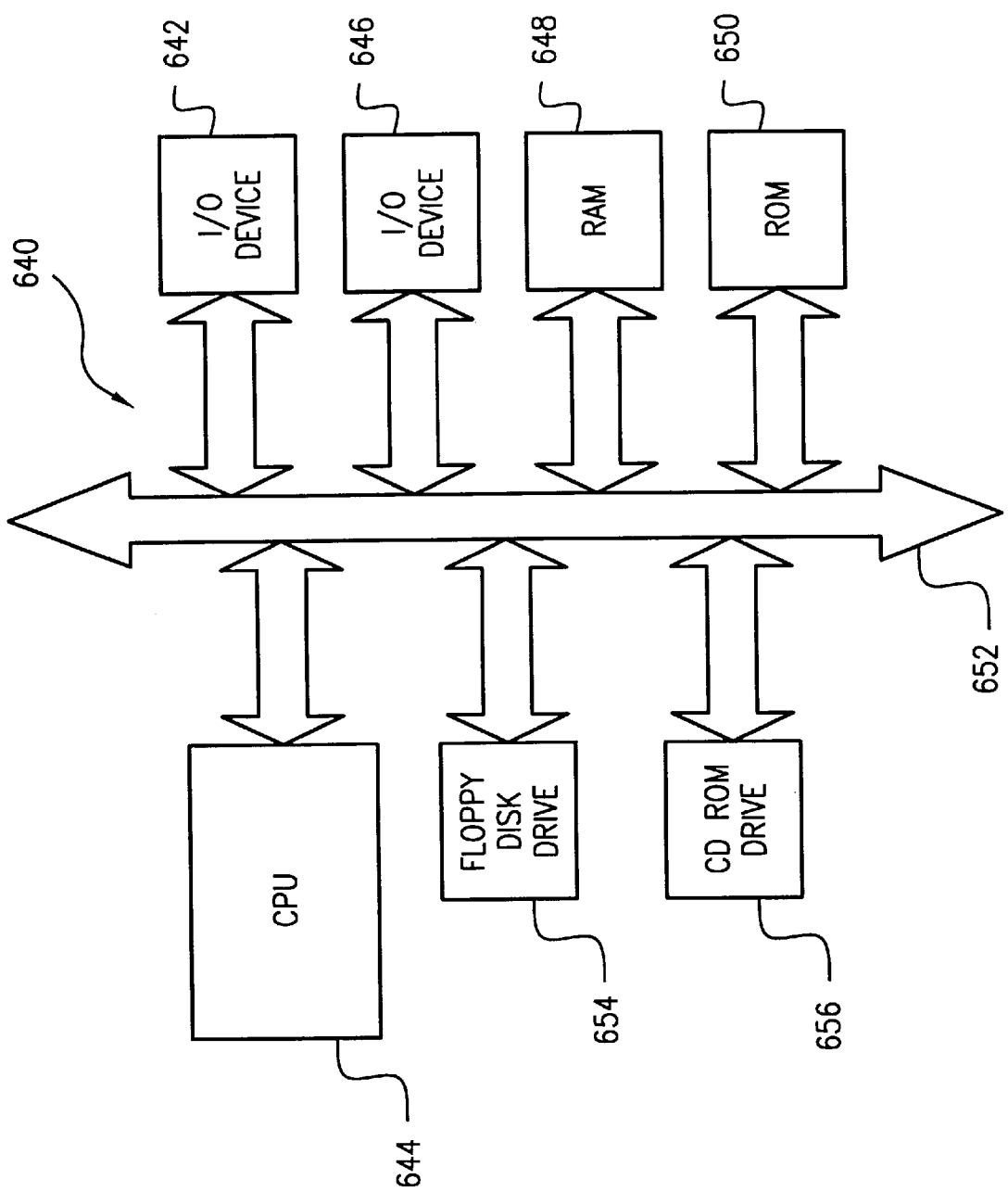
FIG. 8 is a block diagram of a computer system in which the invention may be utilized.

A processor-based system 640 which may use a memory module constructed in accordance with the invention is shown in FIG. 7. Such a processor-based system generally comprises a central processing unit (CPU) 644, e.g. microprocessor, that communicates to at least one input/output (I/O) device 642 over a bus 652. A second (I/O) device 646 is illustrated, but may not be necessary depending upon the system requirements. The processor-based system 640 also may include a static or dynamic random access memory (SRAM, DRAM) 648 in the form of memory modules of the kind described and illustrated above, read only memory (ROM) 650 which may also be formed in the form of memory modules of the kind described above, and may also include peripheral devices such as a floppy disk drive 654 and a compact disk (CD) ROM drive 656 which also communicate with CPU 644 over the bus 652. It must be noted that the exact architecture of the processor-based system 600 is not important and that any combination of processor compatible devices may be incorporated into the system.

The above description and accompanying drawings are only illustrative of preferred embodiments which can achieve and provide the features and advantages of the present invention. It is not intended that the invention be limited to the embodiments shown and described in detail herein. The invention is only limited by the spirit and scope of the following claims.

What is claimed as new and desired to be protected by Letters Patent of the United States is:

1. A multi-layer printed circuit board comprising a plurality of stacked planar layers including at least first and second planar insulator layers and, at least one planar conductor layer located between said first and second insulator layers, wherein at least one of said conductor layer and said first and second insulator layers contains areas of corrugation, at least one of said insulator layers containing a conductive wiring pattern.

2. The printed circuit board of claim 1, wherein said at least one conductor layer comprises at least one power layer and at least one ground layer, wherein at least one of said power and ground layer contains areas of corrugation.

3. The printed circuit board of claim 2, wherein said at least one of said power and ground layers is corrugated across its length.

4. The printed circuit board of claim 2, wherein said at least one of said power and ground layers is corrugated across its width.

5. The printed circuit board of claim 2, wherein said at least one of said power and ground layers is corrugated along at least one edge thereof.

6. The printed circuit board of claim 2, wherein said at least one of said power and ground layers is corrugated along a plurality of edges.

7. A printed circuit board as in claim 2, wherein said ground layer contains said areas of corrugation.

8. A printed circuit board as in claim 2, wherein said power layer contains said areas of corrugation.

9. The printed circuit board of claim 1, wherein at least one of said first and second insulator layers contains said areas of corrugation.

10. The printed circuit board of claim 2, wherein said at least one ground layer and said at least one power layer each contain said areas of corrugation.

11. The printed circuit board of claim 10, wherein said at least one ground layer and said at least one power layer are each corrugated across their length.

12. The printed circuit board of claim 10, wherein said at least one ground layer and said at least one power layer are each corrugated across their width.

13. The printed circuit board of claim 10, wherein said at least one ground layer and said at least one power layer are each corrugated on at least one edge.

14. The printed circuit board of claim 13 wherein said at least one ground layer and said at least one power layer are each corrugated at a plurality of edges.

15. A memory module comprising a printed circuit board securing memory devices, wherein said printed circuit board comprises a plurality of stacked planar layers including at least first and second planar insulator layers and, at least one planar conductor layer located between said first and second insulator layers, wherein at least one of said conductor layer and said first and second insulator layers contains areas of corrugation, at least one of said insulator layers containing a conductive wiring pattern.

16. The memory module of claim 15, wherein said at least one conductor layer comprises at least one power layer and at least one ground layer, wherein at least one of said power and ground layer contains areas of corrugation.

17. The memory module of claim 16, wherein said at least one of said power and ground layers is corrugated across its length.

18. The memory module of claim 16, wherein said at least one of said power and ground layers is corrugated across its width.

19. The memory module of claim 16, wherein said at least one of said power and ground layers is corrugated along at least one edge thereof.

20. The memory module of claim 16, wherein said at least one of said power and ground layers is corrugated along a plurality of edges.

21. The memory module of claim 16, wherein said ground layer contains said areas of corrugation.

22. The memory module of claim 16, wherein said power layer contains said areas of corrugation.

23. The memory module of claim 15, wherein at least one of said first and second insulator layers contains said areas of corrugation.

24. The memory module of claim 16, wherein said at least one ground layer and said at least one power layer each contain said areas of corrugation.

25. The memory module of claim 24, wherein said at least one ground layer and said at least one power layer are each corrugated across their length.

26. The memory module of claim 24, wherein said at least one ground layer and said at least one power layer are each corrugated across their width.

27. The memory module of claim 24, wherein said at least one ground layer and said at least one power layer are each corrugated on at least one edge.

28. The memory module of claim 27, wherein said at least one ground layer and said at least one power layer are each corrugated at a plurality of edges.

29. The memory module of claim 28, wherein said memory module comprises an edge connector.

30. The memory module of claim 28, wherein said memory module comprises a plug-in connector.

31. A computer system including a memory module comprising a printed circuit board securing memory devices, wherein said printed circuit board comprises a plurality of stacked planar layers including at least first and second planar insulator layers and, at least one planar conductor layer located between said first and second insulator layers, wherein at least one of said conductor layer and said first and second insulator layers contains areas of corrugation, at least one of said insulator layers containing conductive wiring pattern.

32. The computer system of claim 31, wherein said at least one conductor layer comprises at least one power layer and at least one ground layer, wherein at least one of said power and ground layer contains areas of corrugation.

33. The computer system of claim 32, wherein said at least one of said power and ground layers is corrugated across its length.

34. The computer system of claim 32, wherein said at least one of said power and ground layers is corrugated across its width.

35. The computer system of claim 31, wherein said at least one of said power and ground layers is corrugated along at least one edge thereof.

36. The computer system of claim 35, wherein said at least one of said power and ground layers is corrugated along a plurality of edges.

37. The computer system of claim 32, wherein said grounding layer contains said areas of corrugation.

38. The computer system of claim 32, wherein said power layer contains said areas of corrugation.

39. The computer system of claim 31, wherein at least one of said first and second insulator layers contains said areas of corrugation.

40. The computer system of claim 32, wherein said at least one ground layer and said at least one power layer each contain said areas of corrugation.

41. The computer system of claim 40, wherein said at least one ground layer and said at least one power layer are each corrugated across their length.

42. The computer system of claim 40, wherein said at least one ground layer and said at least one power layer are each corrugated across their width.

43. The computer system of claim 40, wherein said at least one ground layer and said at least one power layer are each corrugated on at least one edge.

44. The computer system of claim 43, wherein said at least one ground layer and said at least one power layer are each corrugated at a plurality of edges.

45. The computer system of claim 44, wherein said computer system comprises an edge connector.

46. The computer system of claim 44, wherein said computer system comprises a plug-in connector.

47. A method of forming a heat sink within a printed circuit board, said method comprising the steps of:

providing one or more planar insulating layers;

providing one or more planar conductor layers, wherein at least one of said planar conductor layers forms a power supply layer; and providing corrugated areas on said power supply layer.

48. A method of forming a heat sink within a printed circuit board, said method comprising the steps of:

providing one or more planar insulating layers;

providing one or more planar conductor layers, wherein at least one of said planar conductor layers forms a ground supply layer; and providing corrugated areas on said ground supply layer.

49. A method of forming a heat sink within a printed circuit board, said method comprising the steps of:

providing one or more multiple planar surfaces, wherein at least of one of said multiple planar surfaces is a corrugated surface.

50. The method of claim 49, wherein said corrugated surface acts as a grounding supply layer within said printed circuit board.

51. The method of claim 49, wherein said corrugated surface acts as a power supply layer within said printed circuit board.

52. The method of claim 49, wherein said corrugated surface acts as an insulating surface within said printed circuit board.

53. The method of claim 49, wherein said corrugated surface acts as an shielding surface within said printed circuit board.

* * * * *